(12) United States Patent
Li

(10) Patent No.: US 9,158,193 B2
(45) Date of Patent: Oct. 13, 2015

(54) MASK

(71) Applicant: BOE TECHNOLOGY GROUP CO., LTD., Beijing (CN)

(72) Inventor: Wusheng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/357,650

(22) PCT Filed: Apr. 12, 2013

(86) PCT No.: PCT/CN2013/074138
§ 371 (c)(1),
(2) Date: May 13, 2014

(87) PCT Pub. No.: WO2014/127569
PCT Pub. Date: Aug. 28, 2014

(65) Prior Publication Data
US 2015/0177611 A1    Jun. 25, 2015

(30) Foreign Application Priority Data
Feb. 22, 2013    (CN) .......................... 2013 1 0056668

(51) Int. Cl.
*G03F 1/38*    (2012.01)
*G03F 1/00*    (2012.01)

(52) U.S. Cl.
CPC ... *G03F 1/38* (2013.01); *G03F 1/00* (2013.01)

(58) Field of Classification Search
CPC ..................................... G03F 1/00; G03F 1/38
USPC .............................................................. 430/5
See application file for complete search history.

(56) References Cited

FOREIGN PATENT DOCUMENTS

| CN | 101900844 A | 1/2010 |
|---|---|---|
| CN | 102749801 A | 10/2012 |
| WO | 2014/127569 A1 | 8/2014 |

OTHER PUBLICATIONS

Chinese Office Action of Chinese Application No. 201310056668.3 with English translation mailed May 15, 2014.
International Search Report, International Preliminary Report on Patentability and Written Opinion of the International Searching Authority of PCT/CN2013/074138 in Chinese, mailed May 12, 2013.
Written Opinion of the International Searching Authority of PCT/CN2013/074138, mailed Dec. 5, 2013.

*Primary Examiner* — Christopher Young
(74) *Attorney, Agent, or Firm* — Collard & Roe, P.C.

(57) ABSTRACT

A mask is disclosed. The mask includes a light-blocking region and a slit-like light-transmitting region. The slit includes two edges that are disposed oppositely to each other, and each of the edges is made up of a plurality of arcs.

17 Claims, 5 Drawing Sheets

9,158,193 B2

MASK

CROSS REFERENCE TO RELATED APPLICATIONS

This application is the National Stage of PCT/CN2013/074138 filed on Apr. 12, 2013, which claims priority under 35 U.S.C. §119 of Chinese Application No. 201310056668.3 filed on Feb. 22, 2013, the disclosure of which is incorporated by reference. The international application under PCT article 21(2) was not published in English.

FIELD OF THE ART

Embodiments of the invention relate to the field of displays and semiconductor fabrication, more particularly, to a mask.

BACKGROUND

With the development of high resolution display technologies, sizes of the pixels are gradually decreased. To maintain the aperture ratio, metal electrodes of the pixels and line width of the color filter black matrix (BM) have to be narrower as well. However, it is difficult to realize narrower line width in known photolithography processes due to the diffraction effect of light.

Currently, to overcome the influence of the diffraction effect, a method realizes narrower line width by way of a sawtooth-shaped slit as illustrated in FIG. 1. The line width is adjusted by adjusting a width a, a gap b and an angle θ. The advantage of the method lies in that the narrower line width effect can be realized by simply changing the layout design of the mask slits. However, it has the disadvantage of having too many burrs, not smooth and lacking corner design. In fact, a straight line design is normally combined with the sawtooth design. That is, the straight line design is used in a direction not requiring narrower line width while the sawtooth design is inserted in the straight line design for a direction requiring narrower line width as illustrated in FIG. 2. The joining part between the two designs lacks smooth connection design, making the line width at the corner too narrow as to being etched and causing broken-line defect. Furthermore, when both directions require the narrower line width design, the design as FIG. 2 cannot meet the requirement of having narrower line width design in both directions.

SUMMARY

To this end, an embodiment of the invention provides a mask. The mask comprises a light-blocking region and a slit-like light-transmitting region, the slit comprising two edges opposite to each other, wherein each of the two edges comprises a plurality of continuous arcs.

As an example, the plurality of the continuous arcs of the two edges of the slit are symmetrical relative to a central axis, the arcs are preferably semicircles.

As an example, the slit comprises a first slit and a second slit, the first slit and a second slit form a corner, the first slit and the second slit are connected via a corner arc.

Furthermore, the corner comprises an interior angle and an exterior angle, the first slit and the second slit are connected via an interior arc and an exterior arc at the corner.

Furthermore, the interior arc is configured to connect two endpoints of the arcs at both sides of and closest to the interior angle.

Furthermore, the exterior arc is configured to connect two endpoints of the arcs at both sides of and closest to the exterior angle.

As an example, when an angle of the corner is 180 degrees, the central axes of the first slit and the second slit are the same and one central axis.

Furthermore, a connection arc configured to connect the first slit and the second slit is a quarter arc having a radius equal to a half of the difference between inner diameters of the first slit and the second slit.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiment 1

Figure 1:
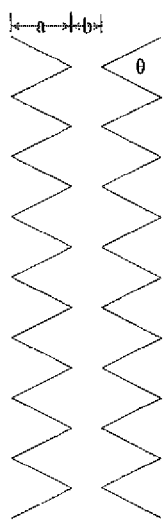
FIG. 1 schematically illustrates a configuration of a slit in a known mask.
Figure 2:
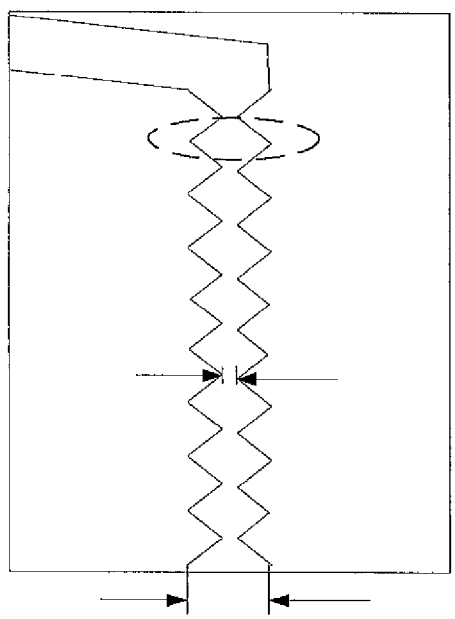
FIG. 2 schematically illustrates a known connection configuration which connects a straight line slit and a sawtooth slit.
Figure 3:
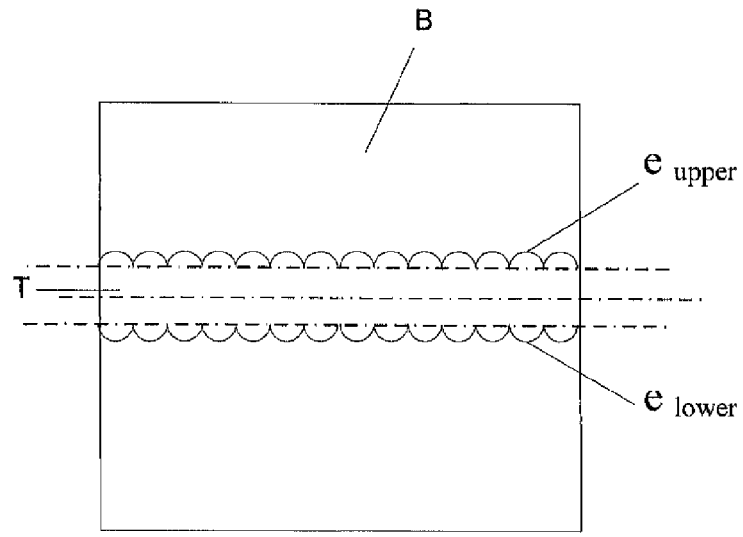
FIG. 3 schematically illustrates a configuration of a mask in accordance with an embodiment of the invention.
Figure 3:
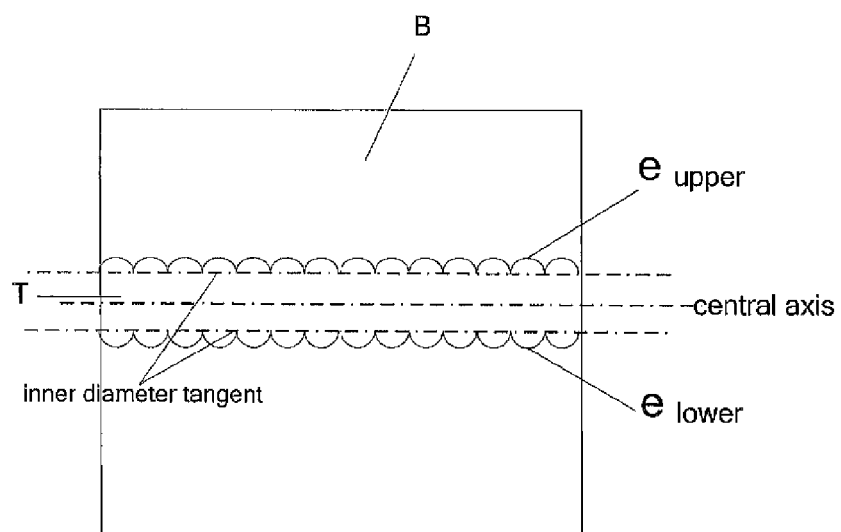

A mask of the embodiment of the invention is illustrated in FIG. 3. The mask comprises a light-blocking region B and a slit-like light-transmitting region T; a slit is disposed on the mask, the slit has two opposite edges, that is, the upper edge $e_{upper}$ and the lower edges $e_{lower}$ of FIG. 3. Each edge comprises a plurality of continuous arcs (that is, a plurality of arcs connects with each other). The locations of ridge-and-valley of the two edges $e_{upper}$ and $e_{lower}$ correspond to each other, and the arcs of the upper and lower edges are symmetrical relative to a central axis along the slit direction.

As an example, the arcs are semicircles. A radius of the semicircle is defined as R; R is for example smaller than 0.5 µm, preferably 0.3 µm. Inner diameter tangent is a straight line (upper or lower dash dot line in FIG. 3) that touches endpoints of each semicircle; a distance between two inner diameter tangents is defined as an inner diameter of the slit (such as the inner diameter A1, A2 illustrated in FIG. 4).

Figure 4:
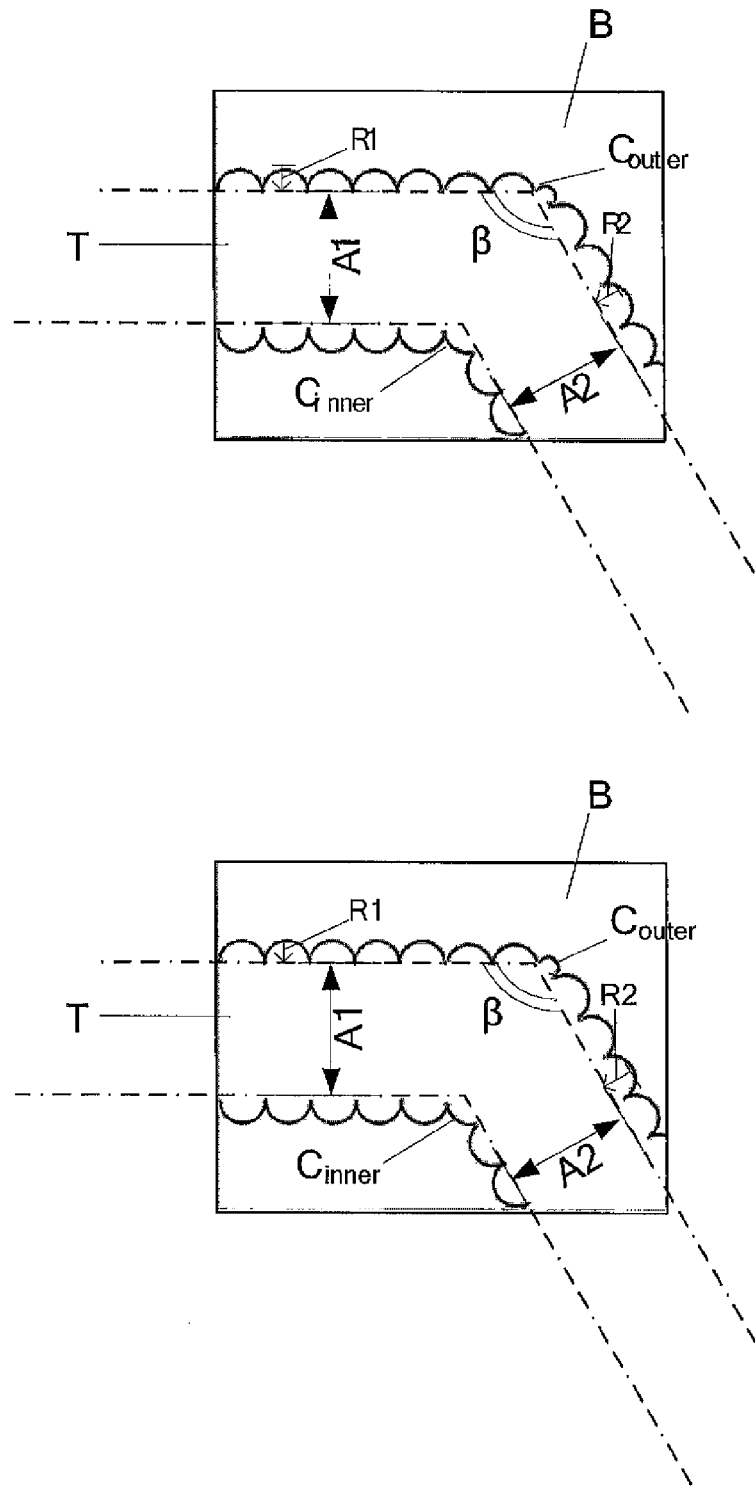
FIG. 4 schematically illustrates a configuration of a corner formed by slits in accordance with an embodiment of the invention.

As an example, the slit comprises a first slit and a second slit, the first slit and the second slit form a corner and are connected via corner arcs. As illustrated in FIG. 4, an angle of the corner is an angle formed between the central line of the first slit and the central line of the second slit, for example it is defined as β. The corner comprises an interior angle and an exterior angle, and the first slit and the second slit are connected via an interior arc $C_{inner}$ and an exterior arc $C_{outer}$ at the corner. The inner diameter tangents of the first slit and the second slit intersect at both an apex of the interior angle and an apex of the exterior angle. The inner diameters of the first slit and the second slit are respectively defined as A1 and A2, the radiuses of the arcs of the first slit and the second slit are respectively defined as R1 and R2, wherein A1 may be equal to or different from A2, and R1 may also be equal to or different from R2.

Specifically, for example, the interior arc $C_{inner}$ is an arc with a radian of β and the apex of interior angle is used as its center of circle, and an average of R1 and R2 is used as its radius (that is, the radius of the interior arc $C_{inner}$ is the average of the radius R1 of the arc of the first slit and the radius R2 of the arc of the second slit). A curved profile formed by the continuous arcs on one of sides of the interior angle starts from the endpoint of the interior arc $C_{inner}$ and extends along the inner diameter tangent on the same side of the interior angle. The center of circle, the radius and the radian of the interior arc $C_{inner}$ are not limited to those disclosed in the embodiment of the invention. A person of ordinary skill in the art can make various modifications on condition that the slits are connected smoothly at the corner and the interior arc $C_{inner}$ connects the two endpoints of the arcs on both sides of and closest to the interior angle.

Each of two curved profiles respectively formed by the arcs on both sides of the exterior angle extends toward the apex of the exterior angle along the respective inner diameter tangent and stops at a point having a distance to the apex of the exterior angle less than a diameter of the arc. Thus, the exterior arc $C_{outer}$ is a semicircle with a diameter equal to a distance between two points where the two curved profiles stop. The radius and the radian of the exterior arc $C_{outer}$ are not limited to those disclosed in the embodiment of the invention. A person of ordinary skill in the art can make various modifications on condition that the slits are connected smoothly at the corner and the exterior arc $C_{outer}$ connects two endpoints of the arcs on both sides of and closest to the exterior angle.

Embodiment 2

The embodiment provides a mask, with a configuration substantially same as Embodiment 1, except for the following difference: the exterior arc $C_{outer}$ is an arc of a circumscribed circle which circumscribes a triangle and touches its three vertices, the three vertices are the two points where the curved profiles stop and the apex of the exterior angle.

Embodiment 3

Figure 5:
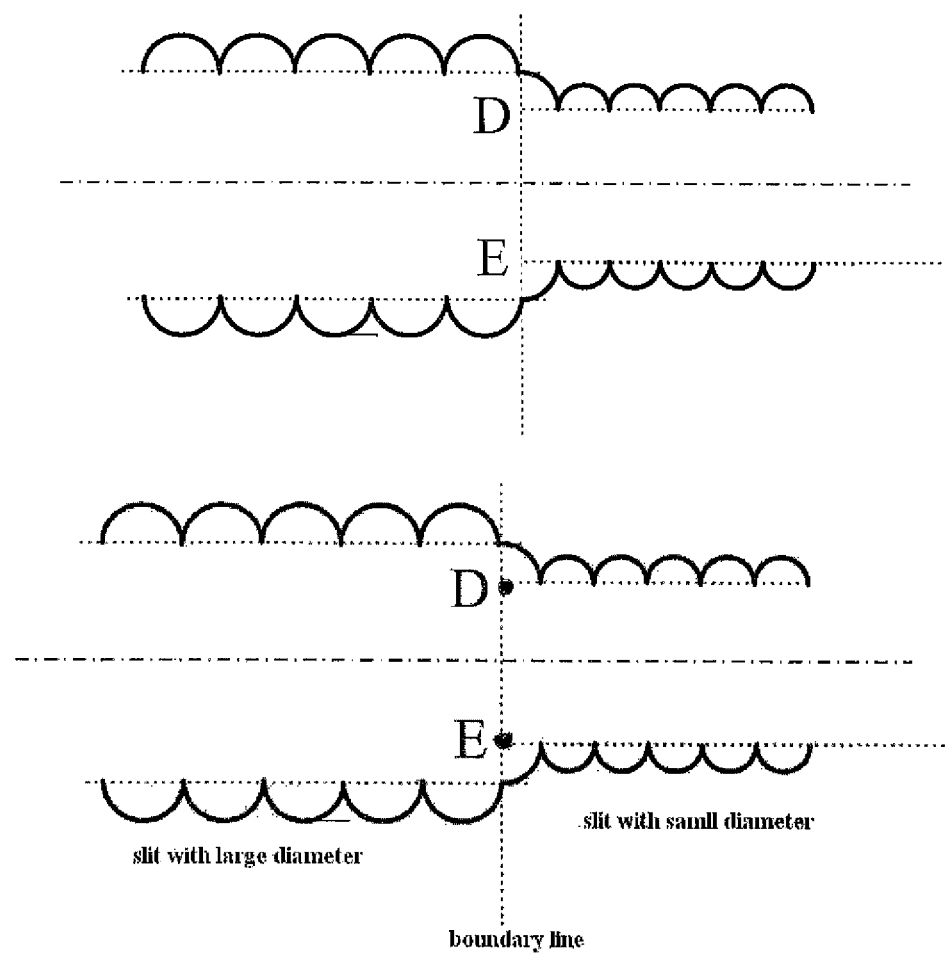
FIG. 5 schematically illustrates a configuration of a mask in which the angle of the corner is 180 degrees in accordance with an embodiment of the invention.

The embodiment of the invention provides a mask, with a configuration substantially same as Embodiments 1 and 2, except for the following difference: an angle of the corner is β=180 degrees, the central axes of the first slit and the second slit are the same and one central axis, as illustrated in FIG. 5.

When the inner diameters A1 and A2 of the first slit and the second slit are equal to each other, the curved profiles formed by the continuous arcs of the first slit are respectively and directly connected with the curved profile formed by the continuous arcs of the second slit without the need for a connection arc.

When the inner diameters A1 and A2 of the first slit and the second slit are not equal to each other, as the case illustrated in FIG. 5, the inner diameter tangents of the slit having a smaller diameter intersect a boundary line at points D and E, the connection arcs are respectively a quarter arc (¼ of arc) with the point D or E as a center of respective circle and a half of the difference between the inner diameters A1 and A2 as a radius. The connection are is not limited to that disclosed in the embodiment of the invention; a person of ordinary skill in the art can make various modifications as required on condition that the slits are connected smoothly at the corner.

Embodiment 4

Figure 6:
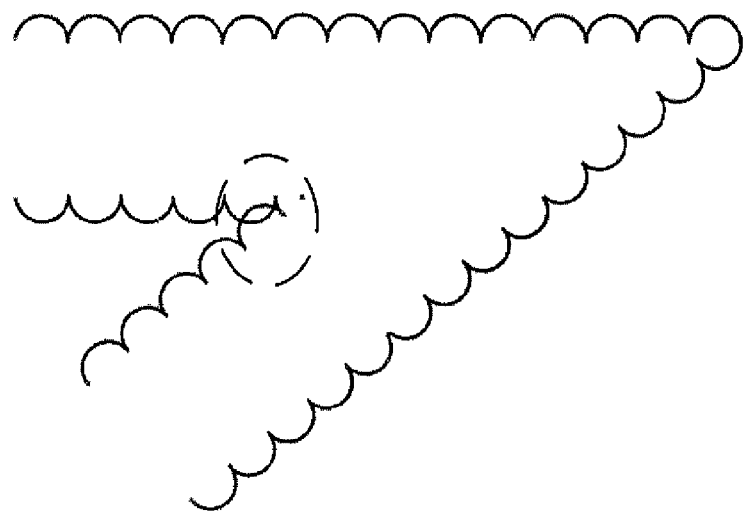
FIG. 6 is a diagram schematically illustrates arcs overlapping each other when the angle of the corner in the mask is too small, in accordance with an embodiment of the invention.
Figure 7:
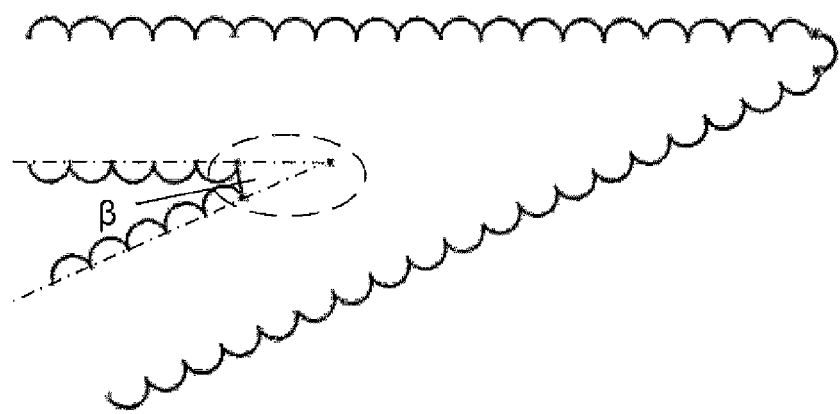
FIG. 7 is a diagram schematically illustrates a mask in which the angle of the corner is too small in accordance with an embodiment of the invention.

The embodiment provides a mask, with a configuration substantially same as Embodiment 1, except for the following difference: when the angle of the corner so small that the arcs at both sides of the interior angle overlap with each other as illustrated in FIG. 6, the overlapping portion of the arcs is firstly removed, and then the two endpoints of the first slit and the second slit closest to the interior angle are connected by the interior arc illustrated in FIG. 7, thereby realizing smooth connection between the first and second slits.

As an example, the interior arc is an arc with a radian of β and a radius of the distance from the apex of the interior angle to the endpoints of the arcs closest to the interior angle.

In the mask according to the above embodiments of the invention, the continuous arcs are used to form the slit, and the corner of the slits is connected smoothly, thereby not only realizing narrower line width but also making the line width smooth and burr-free, which guarantees the uniformity of the line width and effectively avoid the problems of corners having too narrow line width and over-etching, meeting the requirement of having narrower line width along both directions and increasing the defect-free rate and quality of the fabricated products.

The present application claims priority from Chinese Application Serial Number 201310056668.3 filed on Feb. 22, 2013, the disclosure of which is hereby incorporated by reference herein in its entirety.

What are described above is related to the illustrative embodiments of the disclosure only and not limitative to the scope of the disclosure; the scopes of the disclosure are defined by the accompanying claims.

What is claimed is:

1. A mask, comprising a light-blocking region and light-transmitting region comprising a slit, the slit comprising two edges opposite to each other, wherein each of the two edges comprises a plurality of continuous arcs; wherein the slit comprises a first slit and a second slit, the first slit and the second slit form a corner, wherein the first slit and the second slit are connected via a corner arc.

2. The mask of claim 1, wherein the plurality of the continuous arcs of the two edges of the slit are symmetrical relative to a central axis.

3. The mask of claim 1, wherein the arcs are semicircles.

4. The mask of claim 1, wherein the corner comprises an interior angle and an exterior angle, the first slit and the second slit are connected via an interior arc and an exterior arc at the corner.

5. The mask of claim 4, wherein a radius of the interior arc is an average of a radius of an arc of the first slit and a radius of an arc of the second slit, and a radian of the interior arc is equal to an angle of the corner.

6. The mask of claim 4, wherein the interior arc is configured to connect two endpoints of the arcs, the arcs are located on both sides of the interior angle and closest to the interior angle.

7. The mask of claim 4, wherein each of two curved profiles respectively formed by the arcs on both sides of the exterior angle extends toward the apex of the exterior angle and stops at a point having a distance to the apex of the exterior angle less than a diameter of the arc; the exterior arc is a semicircle with a diameter equal to a distance between two points where the two curved profiles stop.

8. The mask of claim 4, wherein each of two curved profiles respectively formed by the arcs on both sides of the exterior angle extends toward the apex of the exterior angle and stops at a point having a distance to the apex of the exterior angle less than a diameter of the arc; the exterior arc is an arc of a circumscribed circle which circumscribes a triangle and touches the two points where the curved profiles stop and the apex of the exterior angle.

9. The mask of claim 4, wherein the exterior arc is configured to connect two endpoints of the arcs, the arcs are located on both sides of the exterior angle and closest to the exterior angle.

10. The mask of claim 1, wherein an angle of the corner is 180 degrees, and the central axes of the first slit and the second slit are the same and one central axis.

11. The mask of claim 4, wherein a connection arc configured to connect the first slit and the second slit is a quarter arc having a radius equal to a half of the difference between inner diameters of the first slit and the second slit.

12. The mask of claim 2, wherein the arcs are semicircles.

13. The mask of claim 4, wherein an angle of the corner is 180 degrees, and the central axes of the first slit and the second slit are the same and one central axis.

14. The mask of claim 5, wherein an angle of the corner is 180 degrees, and the central axes of the first slit and the second slit are the same and one central axis.

15. The mask of claim 6, wherein an angle of the corner is 180 degrees, and the central axes of the first slit and the second slit are the same and one central axis.

16. The mask of claim 7, wherein an angle of the corner is 180 degrees, and the central axes of the first slit and the second slit are the same and one central axis.

17. The mask of claim 8, wherein an angle of the corner is 180 degrees, and the central axes of the first slit and the second slit are the same and one central axis.

* * * * *